United States Patent [19]

Tojo et al.

[11] Patent Number: 4,480,284
[45] Date of Patent: Oct. 30, 1984

[54] ELECTROSTATIC CHUCK PLATE

[75] Inventors: Toru Tojo, Yamato; Ichiro Mori, Tokyo; Shunichi Sano, Zama, all of Japan

[73] Assignee: Tokyo Shibaura Denki Kabushiki Kaisha, Kawasaki, Japan

[21] Appl. No.: 428,341

[22] Filed: Sep. 29, 1982

[30] Foreign Application Priority Data

Feb. 3, 1982 [JP] Japan ................................. 57-15875

[51] Int. Cl.³ ............................................. H01F 13/02
[52] U.S. Cl. ..................................... 361/234; 361/230
[58] Field of Search ................................ 361/234, 230

[56] References Cited

U.S. PATENT DOCUMENTS 3,197,682 7/1965 Klass et al. ........................... 361/234
3,253,200 5/1966 Klass et al. ........................... 361/234
3,330,252 7/1967 Oberg ............................... 361/234 X

FOREIGN PATENT DOCUMENTS

WO79/00510 8/1979 PCT Int'l Appl. .
1443215 7/1976 United Kingdom .

Primary Examiner—Reinhard J. Eisenzopf
Attorney, Agent, or Firm—Oblon, Fisher, Spivak, McClelland & Maier

[57] ABSTRACT

An electrostatic chuck plate comprises an electrode plate made of electrically conductive material and a dielectric layer formed on one surface of the electrode plate by flame-spraying dielectric material. The surface region of the dielectric layer is impregnated with plastic material, and the surface of the dielectric layer is smooth and flat. A sample is electrostatically attracted toward the electrode plate and is thus held on the smooth and flat surface of the dielectric layer.

4 Claims, 2 Drawing Figures

ELECTROSTATIC CHUCK PLATE

BACKGROUND OF THE INVENTION

The present invention relates to an electrostatic chuck plate for electrostatically holding samples, which is made of electrically conductive material or semiconductive material and which is used in processing or inspecting samples.

In processing or inspecting a semiconductor it is necessary to clamp and hold the wafer at a prescribed position. It is required that a wafer be held on a flat table, particularly in drawing a fine pattern on the wafer to thereby manufacture an integrated circuit comprising a number of transistors.

A mechanical chuck, a magnetic chuck, an electric chuck and a vacuum chuck utilizing a pressure difference between fluids are commonly used to clamp and hold samples. The electric chuck is useful in manufacturing semiconductor devices, because it is easy to operate and can hold a sample on a flat table.

The electric chuck, or more precisely an electrostatic chuck, utilizes mutual attraction between two capacitor plates which are electrically charged in the opposite directions. It comprises an electrode and a dielectric layer formed on the electrode. A sample made of electrically conductive material or semiconductive material will be attracted toward the electrode and will thus be held on the dielectric layer. Force F of attraction between the electrode and the sample largely depends on the physical properties of the dielectric layer. Force F is generally given by:

$$F = \tfrac{1}{2} \epsilon_o \cdot \epsilon_s \cdot S \left( \frac{V}{t} \right)^2 \ [N], \tag{1}$$

where $\epsilon_o$ is the vacuum dielectric constant of the dielectric layer, $\epsilon_s$ is the relative dielectric constant of the layer, S is the area of the contact surfaces of the sample and the electrode, V is the voltage applied on the layer and t is the thickness of the layer. Obviously, the greater $\epsilon_s$ is and the smaller t is, the lower may be the voltage V. The dielectric layer must be resistant to both wear and insulation or dielectric strength because a number of samples will be put on it, one at a time.

An electrostatic chuck plate having a dielectric layer made of mica, polyester or barium titanate is disclosed in British Pat. No. 144,321 and "Electrostatic Waferchuck for Electron Beam Microfabrication", George A. Wardly, Rev. Sci. Instrum., Vol 44, No. 10, October 1973, 1506. The dielectric layer is bonded to an electrode disc, using an adhesive agent. The adhesive agent can be hardly applied to form a layer of a uniform thickness. The dielectric layer will thus, in most cases, fail to have a flat surface even if it has a uniform thickness.

An electrostatic chuck plate having a dielectric layer made by an anodic treatment of material is disclosed in Japanese Patent Disclosure (Kokai) No. 55-145351. The dielectric layer is so thin that it will have cracks after many samples have been held on it, one at a time. Once cracks are made in it, the layer can no longer function as an insulator. In order to avoid this, an electrode material may be oxidized very much, thus forming a thicker dielectric layer. A thick dielectric layer has a rough surface, however, and the area of the contact surface of the layer and a sample are extremely small. In this case, the force of attraction between the sample and the electrode will be reduced. Further, the porous portion of the thick dielectric layer has a relative dielectric constant of about 1, whereby the relative dielectric constant of the layer is small. Consequently, the force of attraction between the sample and the electrode will be far smaller than desired.

SUMMARY OF THE INVENTION

The object of the invention is to provide an electrostatic chuck plate which has a layer made of dielectric material having a large dielectric constant, a great mechanical strength and a high wear resistance and in which force of attraction between the sample and an electrode is strong.

According to the invention, an electrostatic chuck plate is provided whose dielectric layer is formed by flame-spraying dielectric material on a flat conductive plate, that is, electrode. The dielectric layer is made of alumina ($Al_2O_3$), titanium dioxide ($TiO_2$) or barium titanate ($BaTiO_3$), or a mixture of these materials and has a sufficiently large dielectric constant. A mixture of these materials can be flame-sprayed at a lower temperature than any one of these materials. If this is the case, there will be easily formed a dielectric layer which can be well processed. The dielectric layer thus formed by flame spraying is firmly sticked to the conductive plate so strongly that it would not peel off even when its surface is polished or lapped to become sufficiently flat.

In short, an electrostatic chuck plate according to the invention comprises an electrode plate and an insulative dielectric layer formed on a major surface of the electrode plate. The plate is designed to attract a sample such as a semiconductor wafer onto the dielectric layer, thus holding the sample immovable.

DETAILED DESCRIPTION OF THE PREFERRED EMBODIMENT

Figure 1:
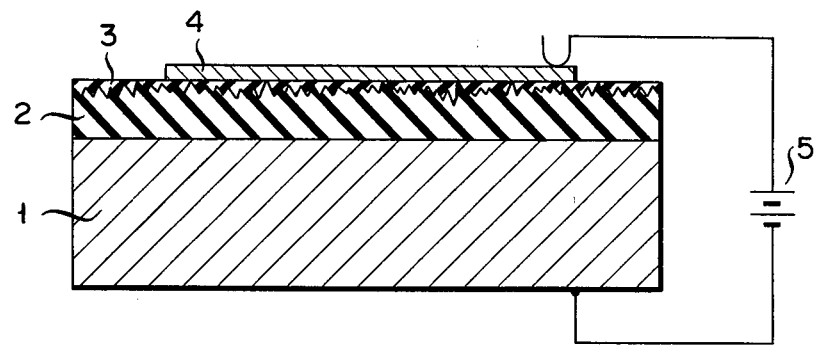
FIG. 1 is a cross-sectional view schematically showing an electrostatic chuck plate according to the present invention.

An electrostatic chuck plate according to the invention is shown in FIG. 1 which is a cross-sectional view. The chuck plate consists of a flat electrode plate 1 and a dielectric layer 2 formed on one flat surface of the electrode plate 2 by flame spraying. The electrode plate 1 is made of aluminum, titanium, copper, stainless steel or the like. The dielectric layer 2 is made of alumina ($Al_2O_3$). It may be made of other dielectric material such as titanium dioxide ($TiO_2$) or barium titanate ($BaTiO_3$), or a mixture of these materials and alumina. The dielectric layer 2 impregnated with plastics 3 made chiefly of a synthetic or semisynthetic high molecular material such as epoxy resin, methacryl resin or fluoreoresin. The surface of the dielectric layer 2 is made flat by polishing, lapping or buffing.

A sample 4 is put on the dielectric layer 2, and an electric field is generated between the electrode 1 and the sample 4. The sample 4 is then attracted onto the dielectric layer 2 and thus held thereon. More specifically, as shown in FIG. 1, the negative terminal of a DC power source 5 is connected to the electrode plate 1 and the positive terminal of the DC power source 5 is connected to the sample 4. An electric field is therefore generated, which extends substantially perpendicular to the dielectric layer 2 and which lies between the electrode plate 1 and the sample 4. The dielectric layer 2 undergoes dielectric polarization, and its lower surface region is positively charged and its upper surface region is negatively charged. As a result, the sample 4 is electrostatically attracted toward the electrode plate 1 and thus held on the dielectric layer 2. The sample 4 is either electrically conductive or semiconductive, and it may be therefore a semiconductor wafer.

Made of alumina flame-sprayed on the electrode plate 1, the dielectric layer 2 has a large mechanical strength and a high wear resistance. In addition, the layer 2 is impregnated with plastic material 3 and is advantageous in the following respect.

Were it not impregnated with plastic material 3, it would be porous and could not help increase the mutual attraction between the electrode plate 1 and the sample 4. Impregnated with plastic material 3, the layer 2 has a large dielectric constant. Were the layer 2 not impregnated with plastic material 3, various gases would flow from the pores into a vacuum envelope in which the chuck plate is disposed, inevitably lowering the degree of vacuum. This undesirable phenomenon will not take place because most pores of the dielectric layer 2 are filled with plastic material 3. Indeed a few pores remain unfilled, but the amount of gases in them is so small that the degree of vacuum is little lowered. The plastic material 3 must have a fluidly high enough to flow well into the pores of the dielectric layer 2. All the pores of the layer 2 need not be filled with plastic material 3. It would be sufficient to fill the material 3 in those pores in the surface region of the layer 2.

The surface of the dielectric layer 2 is polished or lapped to become smooth and flat. Were the layer 2 not impregnated with plastic material 3 and porous, its surface would be rough even if polished or lapped. Impregnated with plastic material 3, the dielectric layer 2 can have such a smooth and falt surface as shown in FIG. 1.

Figure 2:
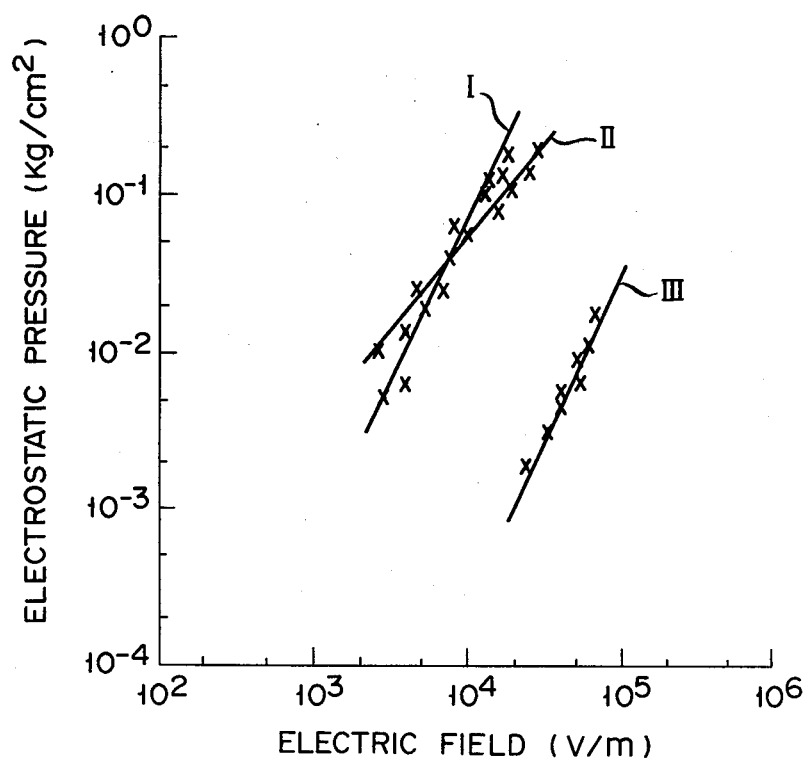
FIG. 2 is a diagram illustrating the relation between force of attraction and intensity of electric field in the plate shown in FIG. 1 and of two known electrostatic chuck plates.

Several electrostatic chuck plates of the structure shown in FIG. 1 were made. These chuck plates and the conventional electrostatic chuck plates were put to test. The result of the test was as shown in FIG. 2, wherein the intensity of an electric field is plotted on the horizontal axis and force of attraction is plotted on the vertical axis. In FIG. 2, line I represents the intensity-force relation of the chuck plate of the invention which had a dielectric layer made by flame-sprayed alumina. Line II represents the intensity-force relation of the known chuck plate having a dielectric layer made by anodizing an aluminum plate. Line III indicates the intensity-force relation of the known chuck plate having a dielectric layer made of epoxy resin.

The present invention is not limited to the embodiment described above. For example, the plastic material is not limited high-molecular material such as epoxy resin or fluoro-resin. Other plastics may be used according to the intended purpose. Further, various methods may be used to apply voltage between the electrode plate and the sample. Still further, the voltage to be applied need not be constant. Voltage that varies at a proper frequency may be applied between the electrode plate and the sample. Other changes and modifications are possible within the scope of the invention.

As described above, according to the present invention various dielectric materials may be used to form a dielectric layer. The dielectric layer may thus have a sufficiently large dielectric constant, a sufficient mechanical strength and a high wear resistance. Since the dielectric layer is formed by flame-spraying a dielectric material on the electrode plate, no adhesive agent is necessary. The dielectric layer is not deteriorated over a long use of the electrostatic chuck plate.

The known chuck plate whose dielectric layer is formed by oxidizing an electrode may warp as the ambient temperature changes. In worst case, it may have cracks as it is heated and cooled repeatedly. This is because the electrode and the dielectric layer have different coefficients of thermal expansion. The chuck plate of the present invention will not warp or have cracks, because the dielectric layer is formed by flame-spraying dielectric material on the electrode and hence the electrode may be made of material having substantially the same coefficient of thermal expansion as that of the dielectric layer or the dielectric layer made be made of material having substantially the same coefficient of thermal expansion as that of the electrode.

According to the invention, the dielectric layer is formed by flame-spraying dielectric material on the electrode. Indeed the dielectric layer fails to have a sufficiently high dielectric strength due to its surface roughness. Nonetheless, once its surface region has been impregnated with plastic material, its dielectric strength becomes sufficiently high.

What we claim is:

1. An electrostatic chuck plate for holding a sample with an electrostatic force, comprising:
   an electrode made of electrically conductive material and having a flat surface; and
   a dielectric layer formed on the flat surface of the electrode by flame-spraying dielectric material, said dielectric layer having a flat surface to be electrically charged to electrostatically attract a sample;
   wherein at least said flat surface of said dielectric layer is impregnated with plastic material.

2. An electrostatic chuck plate according to claim 1, further comprising means for generating an electric field which extends substantially perpendicular to the flat surface of the dielectric layer.

3. An electrostatic chuck plate according to claim 1, wherein said dielectric layer is made of alumina, titanium dioxide, barium titanate, ceramics or a mixture of at least two of these materials.

4. An electrostatic chuck plate according to claim 1, wherein said plastic material contains a high-molecular material selected from the group consisting of methacryl resin, epoxy resin and fluororesin.

* * * * *